United States Patent [19]

Isshiki

[11] Patent Number: 5,149,670
[45] Date of Patent: Sep. 22, 1992

[54] METHOD FOR PRODUCING SEMICONDUCTOR LIGHT EMITTING DEVICE

[75] Inventor: Kunihiko Isshiki, Itami, Japan

[73] Assignee: Mitsubishi Denki Kabushiki Kaisha, Japan

[21] Appl. No.: 712,909

[22] Filed: Jun. 7, 1991

[30] Foreign Application Priority Data

Oct. 26, 1990 [JP] Japan .................................. 2-288882

[51] Int. Cl.$^5$ ................... H01L 21/20; H01L 21/203; H01L 21/265; H01L 21/30
[52] U.S. Cl. ....................................... 437/129; 427/50; 427/133; 427/23; 372/44; 372/46; 357/17
[58] Field of Search ................... 437/24, 82, 126, 127, 437/129, 133, 23, 228, 944, 24; 357/17, 29; 148/DIG. 99, DIG. 100, DIG. 102; 372/44, 46

[56] References Cited

U.S. PATENT DOCUMENTS

| 4,433,417 | 2/1984 | Burnham et al. | 357/17 |
| 4,523,961 | 6/1985 | Hartman et al. | 437/24 |
| 4,546,480 | 10/1985 | Burnham et al. | 357/17 |
| 4,728,628 | 3/1988 | Fiddyment et al. | 437/944 |

FOREIGN PATENT DOCUMENTS

| 0032552 | 2/1986 | Japan | 437/126 |
| 0100974 | 4/1989 | Japan | 437/944 |

OTHER PUBLICATIONS

Dyment et al., "Proton-Bombardment Formation Of Stripe-Geometry Heterostructure Laser For 300 K CW Operation", Proceedings of the IEEE, Jun. 1972, pp. 726-728.

Scifres et al., "Mesa Waveguide GaAs/GaAlAs Injection Laser Grown By Metalorganic Chemical Vapor Deposition", Applied Physics Letters, Jun. 1981, pp. 915-917.

Primary Examiner—Olik Chaudhuri
Assistant Examiner—Loc Q. Trinh
Attorney, Agent, or Firm—Leydig, Voit & Mayer

[57] ABSTRACT

A method of producing a semiconductor light emitting device includes forming a stripe-shaped mesa on a surface of a semiconductor substrate; epitaxially growing a multiple layer structure including at least a first cladding layer, an active layer, a second cladding layer, and a cap layer so that the active layer and cap layer have mesas corresponding to the mesa of the substrate; depositing photoresist on the cap layer to form a flattened surface; removing the photoresist to expose the mesa of the cap layer; removing a portion of the cap layer using the photoresist remaining on the cap layer as a mask to make the surface of the cap layer approximately flat; depositing a thin film to be used as a mask for proton or ion bombardment on the cap layer and on the remaining photoresist; removing the remaining photoresist and the thin film on the remaining photoresist; and bombarding the cap layer with protons and ions using the remaining thin film on the cap layer as a mask to produce higher resistivity regions adjacent the remaining thin film than directly below the remaining thin film. Therefore, highly reliable semiconductor laser devices having good and uniform characteristics can be realized.

15 Claims, 5 Drawing Sheets

METHOD FOR PRODUCING SEMICONDUCTOR LIGHT EMITTING DEVICE

FIELD OF THE INVENTION

The present invention relates to a method for producing a semiconductor light emitting device and, more particularly, to producing insulating regions by proton or ion bombardment with high precision.

BACKGROUND OF THE INVENTION

FIGS. 3(a) to 3(d) are sectional views showing process steps for partially producing high resistance regions by proton bombardment in a conventional method for producing a semiconductor laser device, disclosed in pages 726 to 728 of PROCEEDINGS OF THE IEEE (JUNE 1972). In these figures, reference numeral 1 designates a semiconductor substrate, reference numeral 2 designates a mask material, reference numeral 3 designates a photoresist, reference numeral 4 designates protons, and reference numeral 5 designates high resistivity regions.

A description is given of a conventional proton bombardment with reference to FIGS. 3(a) to 3(d).

First, a mask layer 2 comprising an metal such as gold or titanium or an insulating material such as $SiO_2$ which obstructs the proton bombardment is formed on a semiconductor substrate 1 by such as a vacuum evaporation (FIG. 3(a)).

Then, a stripe-shaped photoresist 3 is formed on the mask layer 2 using photolithography technique (FIG. 3(b)).

Then, a strip-shaped mask for proton bombardment 2a is formed by a selective chemical etching using the photoresist 3 as a mask (FIG. 3(c)). Here, buffered hydrofluoric acid can be used as etchant in either case where the mask layer 2 comprises a metal or an insulating material.

Next, protons bombard the substrate 1 using the mask 2a to induce high resistivity regions 5 (FIG. 3(d)).

FIGS. 4(a) and 4(b) are sectional views each showing a semiconductor laser device having a light guide produced by different refractive indices of adjacent layers and a current confinement structure produced by proton bombardment, disclosed in "Appl. Phys. Lett. 38 (11)". In these figures, reference numeral 11 designates an n type GaAs substrate. An n type $Al_{0.3}Ga_{0.7}As$ cladding layer 12 is disposed on the GaAs substrate 11. An n type or p type or undoped GaAs active layer 13 is disposed on the cladding layer 12. A p type $Al_{0.3}Ga_{0.7}As$ cladding layer 14 is disposed on the active layer 13. A p type GaAs cap layer 15 is disposed on the cladding layer 14. Reference numeral 16 designates an active region.

In FIG. 4(a), the position of mask 2a is deviated from alignment with the stripe portion constituting the active region 16. On the other hand, in FIG. 4(b), the position of mask 2a is aligned with the stripe portion 16. In order to align the position of mask 2a with the stripe portion 16 as shown in FIG. 4(b), high precision is required for the superposition in a photolithography process. When the high resistivity regions 15 deviate from the stripe portion 16 as shown in FIG. 4(a), fatal performance degradation, such as deterioration in linearity of light output vs. current characteristics of the semiconductor light emitting device, occurs.

In the above-described conventional production method, a high precision alignment for the mask 2a is required, and variations in the alignment cause also variations in the element characteristics.

SUMMARY OF THE INVENTION

The present invention is directed to solving the above-described problems and has for its object to provide a method for producing a semiconductor laser device with the current confinement portion aligned with the stripe portion in a relatively simple process with no positional alignment, whereby a semiconductor laser device having good and uniform characteristics is produced.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a method for producing a semiconductor light emitting device includes the steps of forming a laser wafer including a multiple layer structure having a mesa part on a top surface correspondingly to the mesa of the active layer, depositing photoresist on the laser wafer to flatten the surface, partially removing the photoresist to expose the mesa on the surface of the wafer, removing the mesa part on the surface of the wafer by dry etching using the photoresist as a mask, forming a mask for proton or ion bombardment on the exposed portion of the wafer by a lift-off step, and implanting protons and ions into regions which are not masked thereby to produce high-resistivity regions. Therefore, the current confinement portion can be aligned with the stripe portion by a relatively simple process with no positional alignment, resulting in a semiconductor laser device having good and uniform characteristics.

DETAILED DESCRIPTION OF THE PREFERRED EMBODIMENT

An embodiment of the present invention will be described in detail with reference to the drawings.

Figure 1A:
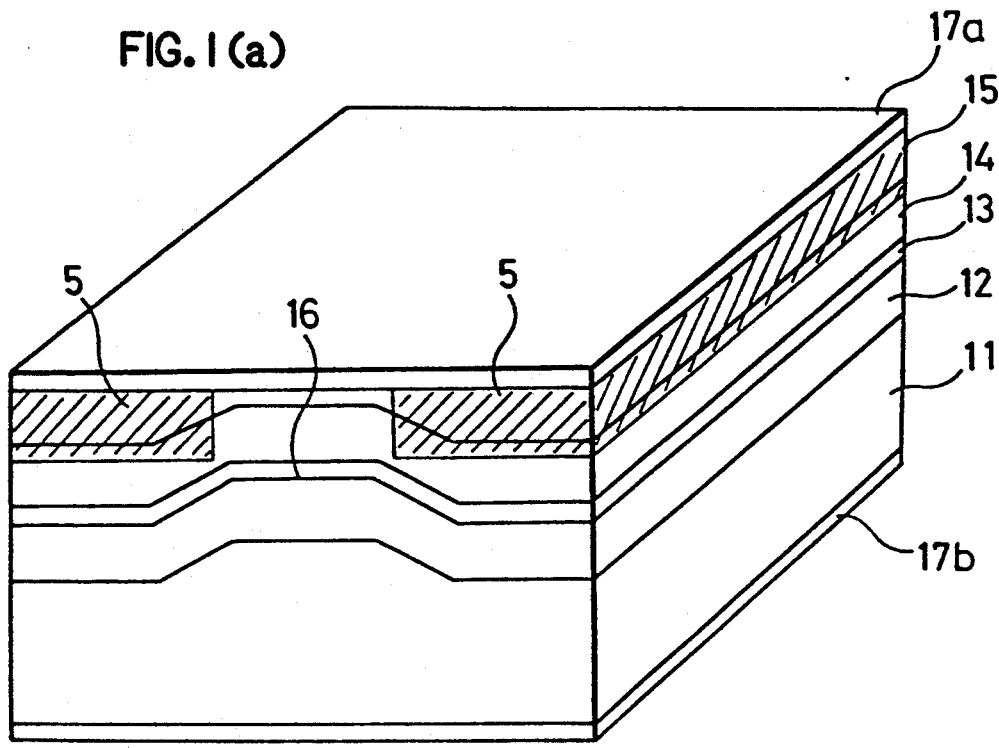
FIGS. 1(a) and 1(b) are a perspective view and a cross-sectional view of a semiconductor light emitting device in accordance with an embodiment of the present invention.
Figure 1B:
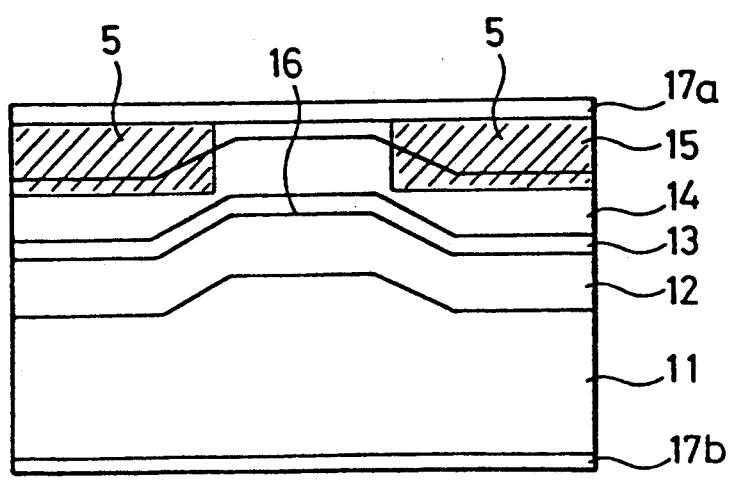

FIGS. 1(a) and 1(b) are a cross-sectional view and a perspective view of a semiconductor laser device in accordance with an embodiment of the present invention. FIGS. 2(a) to 2(f) are cross-sectional views showing a production process of the device of FIG. 1.

In these figures, reference numerals 1 to 5 and 11 to 15 designate the same parts as those shown in the conventional example. In this embodiment, the n type GaAs substrate 11 has a thickness of 100 microns and an impurity concentration of $3 \times 10^{18}$ cm$^{-3}$, the n type Al$_{0.3}$Ga$_{0.7}$As cladding layer 12 has a thickness of 2 microns and an impurity concentration of $1 \times 10^{17}$ cm$^{-3}$, the undoped GaAs active layer 13 has a thickness of 0.1 micron, the p type Al$_{0.3}$Ga$_{0.7}$As cladding layer 14 has a thickness of 2 microns and an impurity concentration of $1 \times 10^{17}$ cm$^{-3}$, and the p type GaAs cap layer 15 has a thickness of 2 microns and an impurity concentration of $5 \times 10^{18}$ cm$^{-3}$. Reference numerals 17a and 17b designate metal electrodes each having a thickness of 0.1 micron.

In this embodiment, the undoped GaAs active layer 13 can be n type or p type. In addition, selenium, silicon or the like can be used as the n type dopant impurity, and zinc, magnesium, beryllium or the like can be used as the p type dopant impurity.

A description is given of a method for producing the device of FIG. 1 hereinafter.

First, a mesa part 11a is formed on an n type GaAs substrate 11 by a selective etching utilizing photolithography. Thereafter, layers 12 to 15 having mesa parts 12a to 15a which correspond to the configuration of the mesa part 11a of the substrate 11, are grown on the substrate 11 by a vapor phase crystal growth method such as MOCVD (Metal Organic Chemical Vapor Deposition) or MBE (Molecular Beam Epitaxy) (FIG. 2(a)).

Figure 2A:
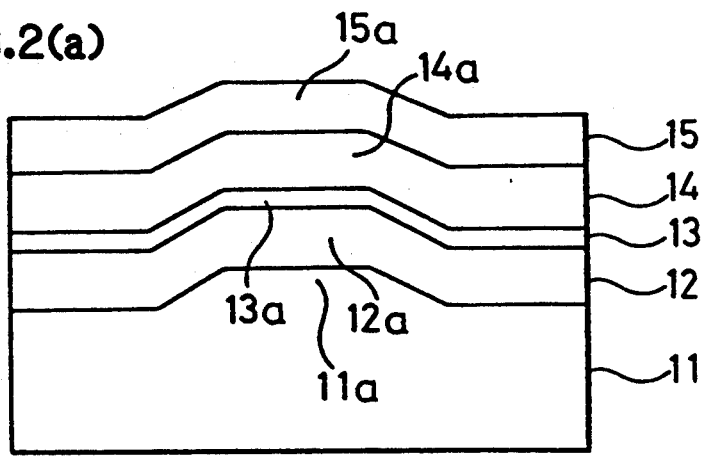
FIGS. 2(a) to 2(f) are cross-sectional views showing process steps for producing the semiconductor light emitting device of FIG. 1.
Figure 2B:
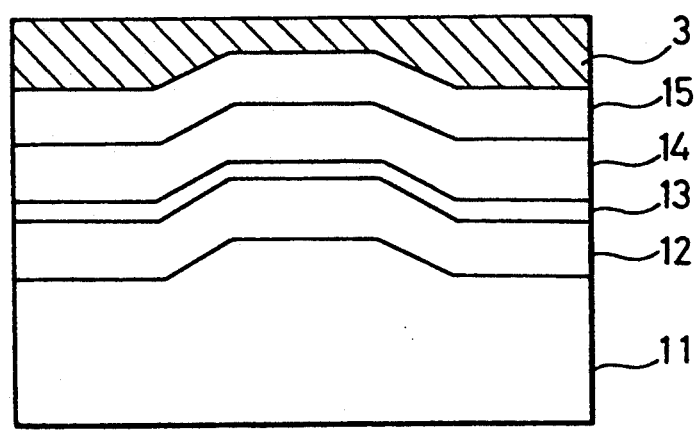

Next, the photoresist 3 having relatively high viscosity is deposited on the wafer surface to flatten the surface including the mesa part 15a at the surface of the photoresist 3 (FIG. 2(b)).

Figure 2C:
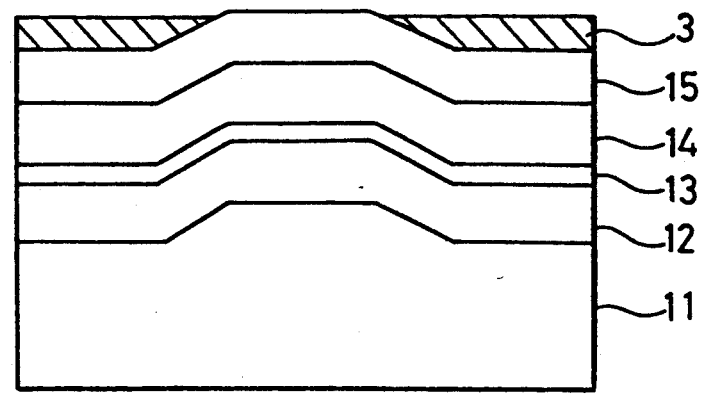

Then, the photoresist 3 is partially removed to expose only the top portion of the mesa part 15a of the cap layer 15 by dry etching utilizing an oxygen plasma (FIG. 2(c)).

Figure 2D:
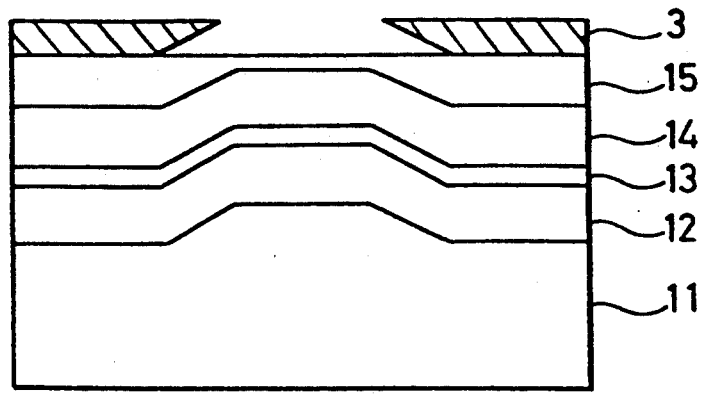

Then, the mesa part 15a of the GaAs cap layer 15 is etched away to have a flat surface using the photoresist 3 as a mask (FIG. 2(d)). Here, a mixed solution comprising ammonia in water and hydrogen peroxide mixed in a ratio of 1:30 or 1:20 is used as etchant.

Figure 2E:
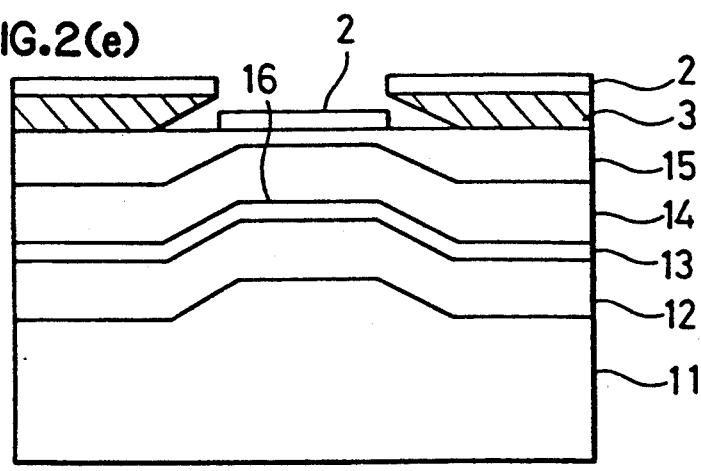

Then, a titanium film 2 is formed on the entire surface by a vacuum evaporation (FIG. 2(e)). Thereafter, the titanium film 2 on the photoresist 3 is removed together with the photoresist 3 by a lift-off step to form the strip-shaped titanium film 2 directly above the mesa part 16 of the active layer 13.

Figure 2F:
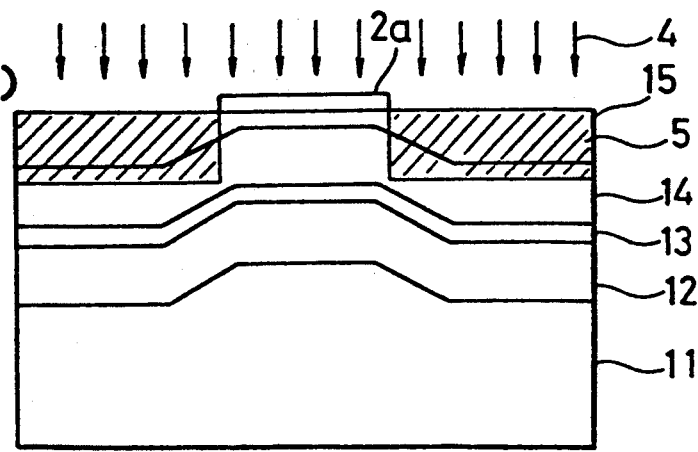
Figure 3A:
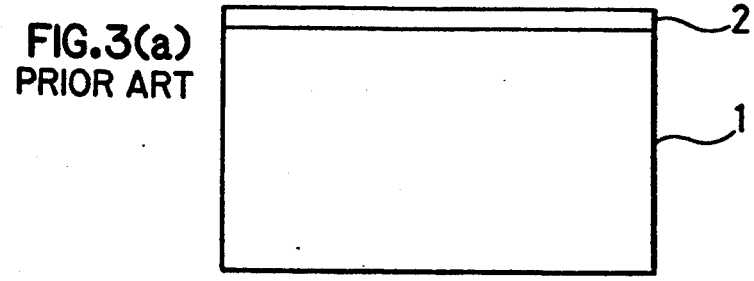
FIGS. 3(a) to 3(d) are cross-sectional views showing process steps for producing a semiconductor light emitting device in accordance with the prior art.
Figure 3B:
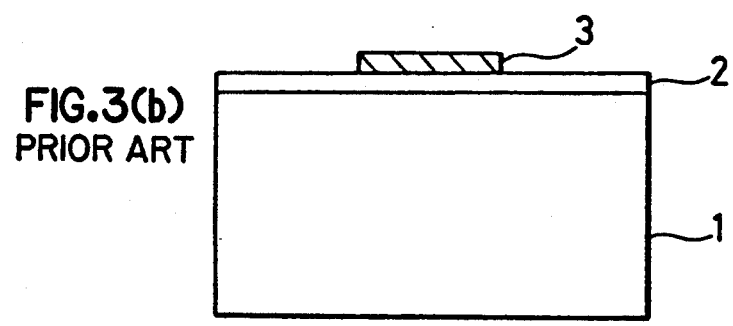
Figure 3C:
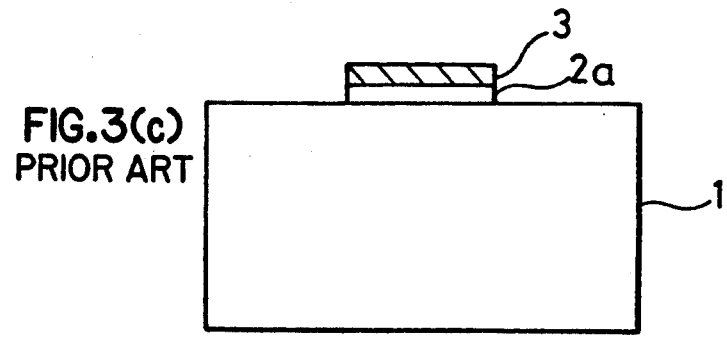
Figure 3D:
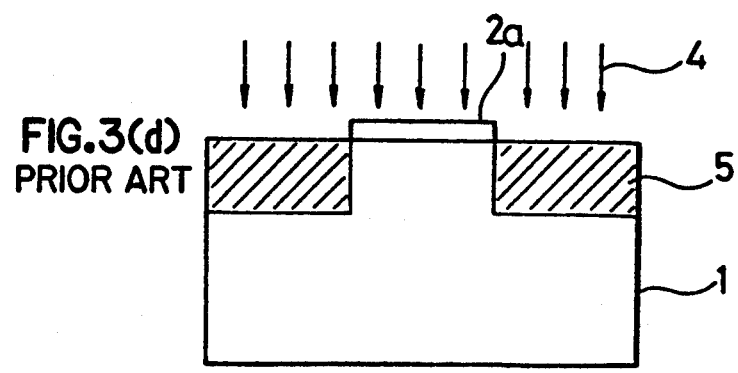
Figure 4A:
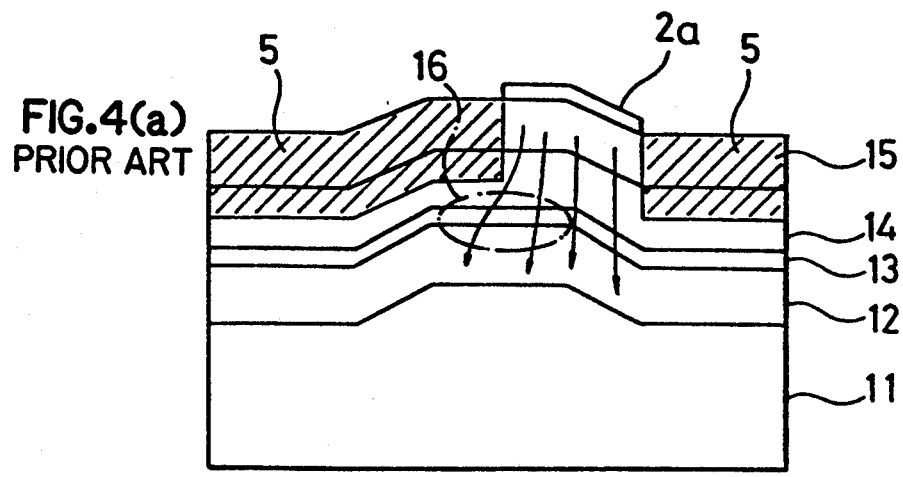
FIG. 4(a) is a cross-sectional view showing a semiconductor light emitting device where a mask is deviated from alignment with the stripe portion.
Figure 4B:
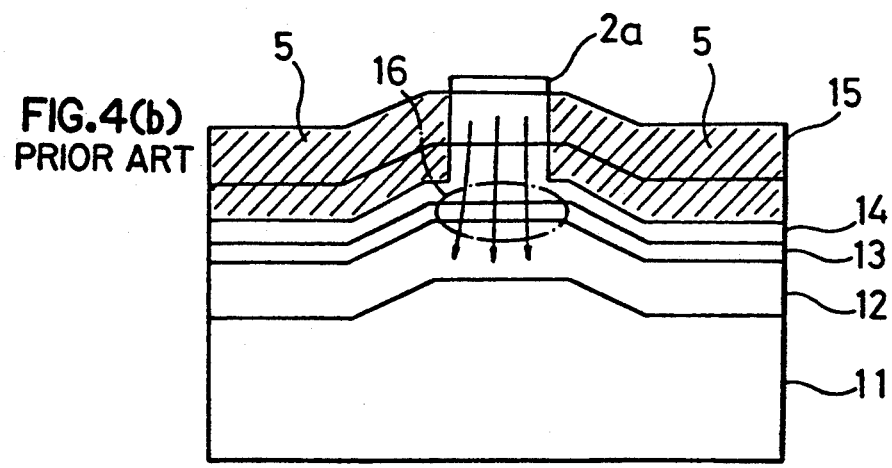
FIG. 4(b) is a cross-sectional view showing a semiconductor light emitting device where a mask is aligned with the stripe portion.

Then, ion bombard the whole surface of the wafer using the titanium film 2a as a mask to form high resistivity regions 5 in the wafer except for the mesa part 16 as an active region (FIG. 2(f)). Thereafter, ohmic metal electrodes 17a and 17b are formed on the top surface and the bottom surface of the wafer, respectively, and then the wafer is divided into chips, resulting in laser elements.

A description is given of the operation. When a voltage in the forward direction with respect to the pn junction in the active layer 13 is applied between the electrodes 17a and 17b, a current concentratedly flows through the mesa part 16 confined by the high resistivity regions 5 and light emission due to charge carrier recombination occurs. The generated light is guided by the lightguide which is produced by the refractive index difference between the cladding layers 12 and 14 and the active layer 13 and the effective refractive index difference caused by the curvature of the active layer 13. Laser oscillation occurs in the Fabry-Perot resonator including the opposing cleavage planes.

In the semiconductor laser device fabricated in accordance with the above-described production process, a current confining part is automatically formed at a position corresponding to the mesa part of the active layer. Therefore, a laser device having good and uniform characteristics up to a high power output is realized.

In the above-described embodiment, since the mask for ion bombardment is self-alignedly formed on the mesa part directly above the active layer stripe, a current path precisely aligned with the mesa part of the active region is formed by ion bombardment, whereby a semiconductor laser device having good characteristics is realized with high reproducibility.

While in the above embodiment GaAs and Al$_{0.3}$Ga$_{0.7}$As are used as the materials of the layers, the Al composition ratio x of Al$_x$Ga$_{1-x}$As is not limited to $x=0$ or $x=0.3$.

While in the above embodiment a semiconductor laser device using AlGaAs is described, the present invention can be applied to a semiconductor laser device using other materials, such as InGaAsP, InGaP, or (AlGa)InP.

While in the above embodiment the high resistance regions are formed by ion bombardment, those regions can be formed by ion bombardment using Fe ions or the like.

In addition, the conductivity type of the respective layers constituting the laser device can be opposite to those of the above embodiment. Then, the laser element will be formed not on an n type substrate but on a p type substrate.

In addition, the present invention can be also applied to other semiconductor light emitting devices such as a facet emitting type LED or a super luminescent diode.

As is evident from the foregoing description, according to the present invention, a production method of a semiconductor light emitting device includes the steps of forming a laser wafer including a multiple layer structure having a mesa on a surface correspondingly to the configuration of the mesa of the active layer, depositing photoresist on the laser wafer to flatten the surface, partially removing the photoresist to expose the mesa on the surface of the wafer, removing the mesa at the surface of the wafer by dry etching using the photoresist as a mask, forming a mask for ion bombardment on the exposed portion of the wafer by a lift-off step, and implanting protons and ions into regions which are not masked thereby to produce high-resistivity regions. Therefore, a current path which is precisely aligned with the mesa of the active region is formed by proton or ion bombardment, so that a semiconductor laser device having good characteristics can be realized with high reproducibility. Furthermore, a mesa on the wafer surface corresponding to the mesa of the active layer is dispensed with and a flat element surface is obtained.

What is claimed is:

1. A method for producing a semiconductor light emitting device comprising the steps of:

forming a stripe-shaped mesa on a surface of a semiconductor substrate;

epitaxially growing a multiple layer structure including at least a first cladding layer, an active layer, a second cladding layer, and a cap layer on said semiconductor substrate so that said active layer and cap layer have stripe-shaped mesas corresponding to the mesa of said substrate;
depositing photoresist on said cap layer to provide a flattened surface;
removing said photoresist to expose said mesa of said cap layer;
removing a portion of said cap layer using the photoresist remaining on said cap layer as a mask to make said cap layer approximately flat;
depositing a thin film to be used as a mask for ion bombardment on said cap layer and on the remaining photoresist;
removing the remaining photoresist together with the thin film disposed on the remaining photoresist; and
bombarding the cap layer with ions using the remaining thin film on said cap layer as a mask to produce higher resistivity regions adjacent the remaining thin film than directly below the remaining thin film.

2. A method of producing a semiconductor light emitting device as defined in claim 1 including epitaxially growing said multiple layer structure by one of metal organic chemical vapor deposition and molecular beam epitaxy.

3. A method of producing a semiconductor light emitting device as defined in claim 1 including removing said photoresist to expose said cap layer by dry etching using an oxygen plasma.

4. A method of producing a semicondcutor light emitting device as defined in claim 1 including depositing a metal as said thin film to be used as a mask for said ion bombardment.

5. A method of producing a semiconductor light emitting device as defined in claim 1 including depositing titanium as said metal film.

6. A method of producing a semiconductor light emitting device as defined in claim 5 including depositing said titanium film on the surface of said cap layer and on the surface of said photoresist by vacuum evaporation.

7. A method of producing a semiconductor light emitting device as defined in claim 1 including depositing an insulating film as said thin film to be used as a mask for said ion bombardment.

8. A method of producing a semiconductor light emitting device as defined in claim 7 including depositing silicon dioxide as said insulating film .

9. A method of producing a semiconductor light emitting device as defined in claim 1 wherein said semiconductor substrate comprises first h-conductivity type GaAs.

10. A method of producing a semiconductor light emitting device as defined in claim 9 including forming said mesa in said substrate by selective etching using buffered hydrofluoric acid.

11. A method of producing a semiconductor light emitting device as defined in claim 9 wherein said first cladding layer comprises first conductivity type $Al_x Ga_{1-x}As$ ($0<x<1$), said active layer comprises $Al_y Ga_{1-y}As$ ($0<y<x$), said second cladding layer comprises second conductivity type $Al_z Ga_{1-z}As$ ($x<z<1$) and said cap layer comprises second conductivity type GaAs.

12. A method of producing a semiconductor light emitting device as defined in claim 11 including removing a portion of said cap layer using a mixed solution comprising ammonia in water and hydrogen peroxide mixed in a ratio of 1:30 or 1:20.

13. A method of producing a semiconductor light emitting device as defined in claim 11 wherein said first conductivity type is n type and said second conductivity type is p type.

14. A method of producing a semiconductor light emitting device as defined in claim 13 wherein selenium or silicon is used as said n type dopant impurity and magnesium or beryllium is used as said p type dopant impurity.

15. A method of producing a semiconductor light emitting device as defined in claim 1 including bombarding the cap layer with Fe ions.

* * * * *